United States Patent
Shrivastava et al.

(10) Patent No.: US 10,535,762 B2
(45) Date of Patent: Jan. 14, 2020

(54) FINFET SCR WITH SCR IMPLANT UNDER ANODE AND CATHODE JUNCTIONS

(71) Applicant: Indian Institute of Science, Bangalore (IN)

(72) Inventors: Mayank Shrivastava, Bangalore (IN); Milova Paul, Bangalore (IN); Harald Gossner, Riemerling (DE)

(73) Assignee: INDIAN INSTITUTE OF SCIENCE, Karnataka, Bangalore (IN)

( * ) Notice: Subject to any disclaimer, the term of this patent is extended or adjusted under 35 U.S.C. 154(b) by 0 days.

(21) Appl. No.: 15/899,102

(22) Filed: Feb. 19, 2018

(65) Prior Publication Data
US 2018/0248025 A1   Aug. 30, 2018

(30) Foreign Application Priority Data
Feb. 25, 2017   (IN) .............. 201741006746

(51) Int. Cl.
| | |
|---|---|
| H01L 29/74 | (2006.01) |
| H01L 27/02 | (2006.01) |
| H01L 29/06 | (2006.01) |
| H01L 29/08 | (2006.01) |
| H01L 29/66 | (2006.01) |
| H01L 29/45 | (2006.01) |
| H01L 29/78 | (2006.01) |
| H01L 21/285 | (2006.01) |

(52) U.S. Cl.
CPC ........ *H01L 29/742* (2013.01); *H01L 27/0262* (2013.01); *H01L 29/068* (2013.01); *H01L 29/083* (2013.01); *H01L 29/0808* (2013.01); *H01L 29/66378* (2013.01); *H01L 29/66393* (2013.01); *H01L 29/7424* (2013.01); *H01L 29/7436* (2013.01); *H01L 21/28518* (2013.01); *H01L 29/456* (2013.01); *H01L 29/785* (2013.01)

(58) Field of Classification Search
CPC .............. H01L 29/742; H01L 27/0262; H01L 29/7424; H01L 29/7436; H01L 27/0259
See application file for complete search history.

(56) References Cited

U.S. PATENT DOCUMENTS

| | | |
|---|---|---|
| 6,909,149 B2 | 6/2005 | Russ et al. |
| 7,135,745 B1 | 11/2006 | Horch et al. |
| 7,638,370 B2 | 12/2009 | Gossner et al. |
| 8,963,201 B2 | 2/2015 | Shrivastava et al. |
| 9,236,374 B2 | 1/2016 | Campi, Jr. et al. |

(Continued)

Primary Examiner — Changhyun Yi
(74) Attorney, Agent, or Firm — Michael Best & Friedrich LLP

(57) ABSTRACT

SCRs are a must for ESD protection in low voltage—high speed I/O as well as ESD protection of RF pads due to least parasitic loading and smallest foot print offered by SCRs. However, conventionally designed SCRs in FinFET and Nanowire technology suffer from very high turn-on and holding voltage. This issue becomes more severe in sub-14 nm non-planar technologies and cannot be handled by conventional approaches like diode- or transient-turn-on techniques. Proposed invention discloses SCR concept for FinFET and Nanowire technology with diffused junction profiles with sub-3V trigger and holding voltage for efficient and robust ESD protection. Besides low trigger and holding voltage, the proposed device offers a 3 times better ESD robustness per unit area.

20 Claims, 12 Drawing Sheets

(56) References Cited

U.S. PATENT DOCUMENTS

| | | |
|---|---|---|
| 9,240,471 B2 | 1/2016 | Di Sarro et al. |
| 2004/0207021 A1 | 10/2004 | Russ et al. |
| 2005/0212051 A1 | 9/2005 | Jozwiak et al. |
| 2009/0206367 A1 | 8/2009 | Gauthier, Jr. et al. |
| 2010/0207161 A1 | 8/2010 | Shrivastava et al. |
| 2014/0097465 A1 | 4/2014 | Shrivastava et al. |
| 2017/0323942 A1* | 11/2017 | Voldman .............. H01L 29/1083 |
| 2018/0190644 A1* | 7/2018 | Li ........................ H01L 27/0262 |

* cited by examiner

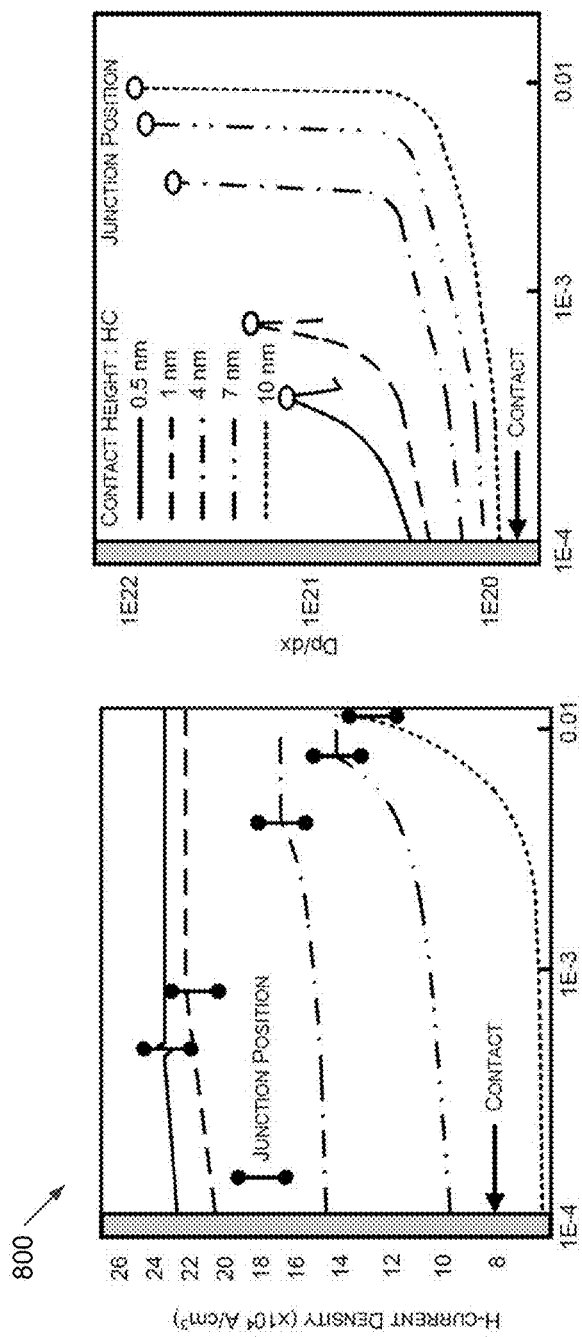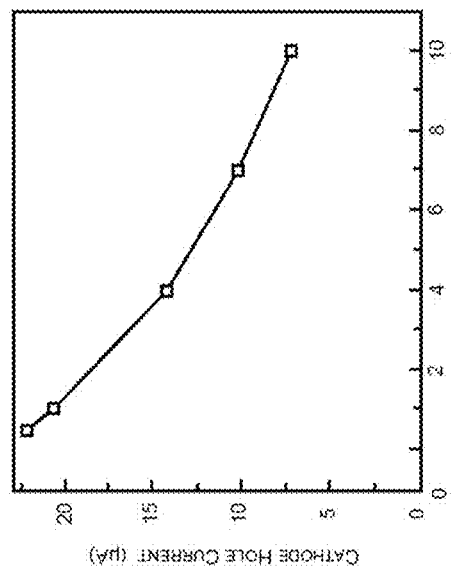
FIG. 8(a)
FIG. 8(b)
FIG. 8(c)

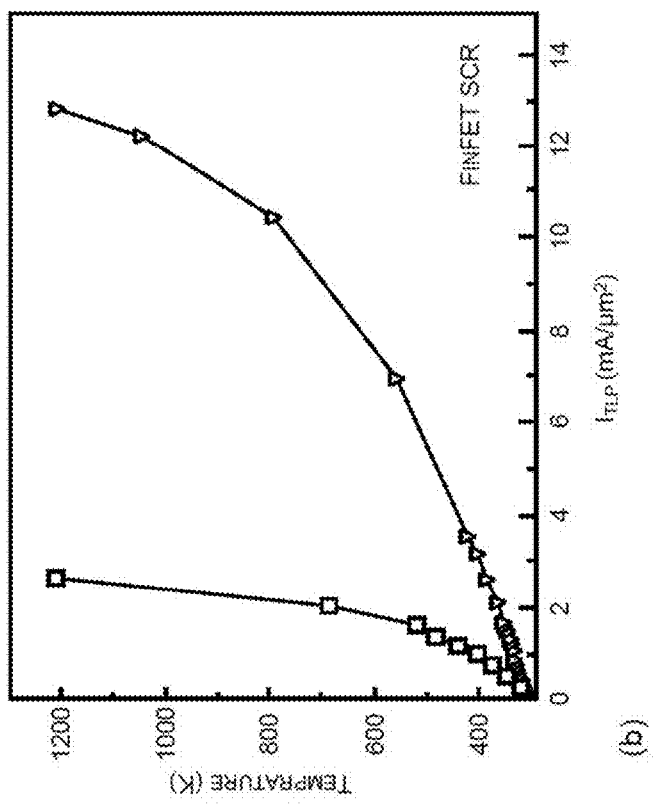
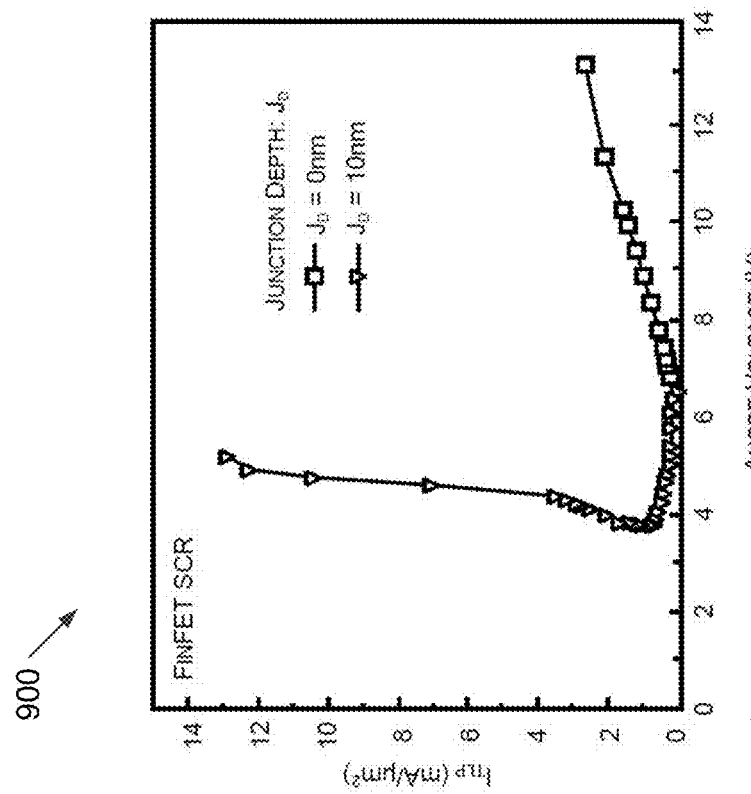
FIG. 9(a)
FIG. 9(b)

FINFET SCR WITH SCR IMPLANT UNDER ANODE AND CATHODE JUNCTIONS

TECHNICAL FIELD

The present invention relates generally to the field of semiconductor devices, and more particularly to non-planar semiconductor devices.

BACKGROUND

Background description includes information that may be useful in understanding the present invention. It is not an admission that any of the information provided herein is prior art or relevant to the presently claimed invention, or that any publication specifically or implicitly referenced is prior art.

With planar bulk Metal-Oxide Semiconductor (MOS) devices reaching their scaling limits, FinFETs, Trigate, and similar non-planar technologies have become popular in recent days for use in technologies for sub-14 nm gate lengths. These technologies are found to be promising for System on Chip (SoC) applications that need reduced system cost, size, and power while enjoying improved system performance. A SoC chip in advanced CMOS consists of various analog, RF, and digital functional blocks, each of which requires dedicated ESD protection. SCRs, for example, are a must for Electrostatic Discharge (ESD) protection in low voltage-high speed I/O as well as for ESD protection of RF pads due to least parasitic loading and smallest foot print offered by SCRs. Existing SCRs suffer from very high turn-on and holding voltage, which issue becomes even severe in non-planar technologies and cannot be handled by conventional approaches such as diode- or transient-turn-on techniques.

Although the advent of non-planar technologies has paved new and efficient ways to replace their planar counterparts by offering beneficial technological solutions to scale conventional transistors, this has come with a price of lowered ESD robustness in these advanced technology nodes. ESD is a random event that leads to massive flow of current (in amperes) between bodies having different electrostatic potential for sub-500 ns duration. Such high current injection can cause severe device damage by gate oxide breakdown or meltdown of device active area. Therefore, it is important to design effective ESD protection solutions in non-planar technology nodes.

As planar bulk MOS devices reach their scaling limits, FinFETs, Trigate and similar non-planar technologies have become popular in the recent times as technology options for sub 14 nm gate lengths. These technologies are also a promising option for System on Chip (SoC) applications, where key requirements are reduced system cost, size and power while enjoying improved system performance. FinFET, also known as Fin Field Effect Transistor, is a type of non-planar or "3D" transistor used in the design of modern processors. Although providing excellent electrostatic advantages, FinFETs and other non-planar architectures suffer from lowered ESD robustness. In the last about a decade, there have been extensive investigations on designing several ESD protection concepts like Diodes, Bipolar Junction Transistors (BJTs), Metal-oxide-semiconductor field effect transistors (MOSFETs) and SCRs in FinFET technology. FinFET technology may also be used for SoC (System on chip) devices now in great demand in the ULSI industry. A SoC chip consists of various analog, RF and digital functional blocks, each requiring dedicated ESD protection concepts.

Several other prior arts, for example Russ et. al. US2004/0207021 A1, Russ et. al. U.S. Pat. No. 6,909,149 B2. Jozwiak, et al. US2005/0212051 A1, Gauthier: US2009/0206367 A1, Harald Gossner: U.S. Pat. No. 7,638,370B2, Mayank Shrivastava: US 2010/0207161 A1, James P. Di Sarro: U.S. Pat. No. 9,240,471B2 and John B. Campi: U.S. Pat. No. 9,236,374B2, Andrew Horch: U.S. Pat. No. 7,135,745B1, Mayank Shrivastava: U.S. Pat. No. 8,963,201B2 and Mayank Shrivastava: US2014/0097465A1 demonstrate various ways of implementing SCR-like devices in planar SOI and FinFET technologies with a weak tuning capability of holding and trigger voltage. However, they still do not provide a robust tuning capability or low trigger/holding voltage.

Hence, it is of crucial importance to design effective ESD protection solutions in non-planar technologies. Solutions proposed should have low turn-on and holding voltage for efficient and robust ESD protection.

All publications herein are incorporated by reference to the same extent as if each individual publication or patent application were specifically and individually indicated to be incorporated by reference. Where a definition or use of a term in an incorporated reference is inconsistent or contrary to the definition of that term provided herein, the definition of that term provided herein applies and the definition of that term in the reference does not apply.

In some embodiments, the numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the invention are approximations, the numerical values set forth in the specific examples are reported as precisely as practicable. The numerical values presented in some embodiments of the invention may contain certain errors necessarily resulting from the standard deviation found in their respective testing measurements.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

The recitation of ranges of values herein is merely intended to serve as a shorthand method of referring individually to each separate value falling within the range. Unless otherwise indicated herein, each individual value is incorporated into the specification as if it were individually recited herein. All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all groups used in the appended claims.

OBJECTS OF THE INVENTION

It is an object of the present invention to design an effective ESD protection solution in non-planar technologies.

It is an object of the present invention to design an effective ESD protection solution that enables low turn-on and holding voltage for efficient and robust ESD protection.

It is an object of the present invention to design an effective ESD protection solution for ultra scaled technologies.

It is an object of the present invention to design an effective ESD protection solution that enables robust tuning capability or low trigger/holding voltage.

SUMMARY

The present disclosure is provided mainly to solve the technical problems of the prior art existed. The principle technical problem that the present disclosure solves is the issue of designing an effective ESD protection solution in non-planar technologies which provides higher ESD robustness with low turn-on and holding voltage. Specifically, the present disclosure solves a challenge from technology point of view to provide effective ESD protection in ultra scaled technologies, such as in SCR's, which suffers from high turn-on and holding voltage. This issue becomes even more severe in non-planar technologies and cannot be handled by conventional approaches such as diode- or transient-turn-on techniques.

In an aspect, the present disclosure relates to a silicon controlled rectifier (SCR) comprising: an anode region below which is configured a first implant region; and a cathode region below which is configured a second implant region, wherein implant dopant in the first implant region is of conductivity type used in the anode region and implant dopant in the second implant region is of conductivity type used in the cathode region.

In an aspect, doping type from the anode region and the cathode region to the first implant region and the second implant region has continuous conductivity type.

In another aspect, the first and second implant regions can be implanted in inactive region that is sandwiched between STI below the anode and cathode regions.

In another aspect, there is no p-n junction between the anode/cathode regions and the first/second implant regions that are implanted underneath.

In yet another aspect, the first implant region and the second implant region can suppress minority carrier current from the anode/cathode regions so as to increase bipolar gain.

In yet another aspect, the SCR can include a P-well and a N-well that are configured on a substrate, wherein the P-well is connected to the cathode region and a P-tap region, and wherein the N-well is connected to the anode region and a N-tap region. The N-tap region and the P-tap region can be swapped with the anode region and the cathode region respectively. The N-tap region and the P-tap region can be used as independent contacts to trigger one or the other (PNP or NPN) parasitic bipolar of the SCR In another aspect, the first implant region and the second implant region can assist in obtaining a regenerative feedback between the base collector junctions of the two back-to-back bipolar transistors to enable the SCR to shunt the ESD current.

In yet another aspect, the first implant region and the second implant region can be configured as deeper emitter junction profiles to improve snapback characteristics.

In yet another aspect, the SCR is a fin SCR.

The present disclosure further relates to a method of manufacturing a SCR, said method comprising the steps of: configuring an SCR implant that comprises a first implant region configured below an anode region and a second implant region configured below a cathode region; and configuring a P-tap region along with the cathode region and configuring a N-tap region along with the anode region. In an aspect, the P-tap region and the cathode region can be connected to a P-well, and wherein the N-tap region and the anode region are connected to a N-well. In yet another aspect, the proposed can further include the step of siliciding the P-tap region and the cathode region along with the N-tap region and the anode region.

The present disclosure further relates to a semiconductor device comprising an anode region below which is configured a first implant region: and a cathode region below which is configured a second implant region, wherein implant dopant in the first implant region is of conductivity type used in the anode region and implant dopant in the second implant region is of conductivity type used in the cathode region. In an aspect, the device can include one or more guard rings. In another aspect, the device can include at least one fin made of nanowire or an array of nanowires on top of each other. The fin can also be made of any or a combination of Si, SiGe, and Ge, materials belonging to III-V or III-Nitride groups, transition metal dichalcogenides or other 2-Dimensional semiconductors. In another aspect, 3D structure of the proposed semiconductor device can be repeated in X and Y directions so as to create devices with larger electrical widths. In yet another aspect, substrate of the device can pertain to any or a combination of a semiconductor, an insulator, and a stack of the semiconductor and insulator. In another aspect, the present disclosure relates to an integrated circuit made of semiconductor device as described above.

In another aspect, the present disclosure relates to a silicon controlled rectifier (SCR) comprising set of fins made of a semiconducting material, each of said set of fins comprising an active region that is above shallow trench isolation (STI) surface, and an inactive region that is sandwiched between STI region: an anode region formed using a first subset of said set of fins, wherein a first implant region is configured below said anode region; a cathode region formed using a second subset of said set of fins, wherein a second implant region is configured below said cathode region, wherein implant dopant in the first implant region is of conductivity type used in the anode region, and implant dopant in the second implant region is of conductivity type used in the cathode region.

In an aspect, doping profile from the anode region and the cathode region to the first implant region and the second implant region respectively can be continuous in nature.

In another aspect, the first and second implant regions can be present in the inactive region that can be sandwiched between STI below the anode and cathode regions.

In another aspect, there may be no p-n junction between the anode/cathode regions and the first/second implant regions that are implanted underneath. In another aspect, the first implant region and the second implant region can suppress minority carrier current through the anode/cathode regions so as to increase bipolar gain.

In another aspect, the SCR can include a P-well and a N-well that can be configured on a substrate, wherein the cathode region and P-tap region can be disposed inside the P-Well, and wherein the anode region and N-tap region can be disposed inside the N-Well. In an aspect, the N-tap region and the P-tap region can be swapped with the anode region and the cathode region respectively. In another aspect, the N-tap region and the P-tap region can be used as independent contacts to trigger one or the other (PNP or NPN) parasitic bipolar of the SCR.

In an aspect, the first implant region and the second implant region can assist in obtaining a regenerative feedback between the base collector junctions of the two back-to back bipolar transistors to enable SCR to shunt the ESD current.

In an aspect, the first implant region and the second implant region can be configured as deeper emitters regions to improve snapback characteristics.

In another aspect, the SCR can be a Nanowire SCR where the set of fins is replaced by a set of semiconducting Nanowires.

The present disclosure further relates to a method of manufacturing a SCR, said method comprising the steps of: configuring an SCR implant that comprises a first implant region configured below an anode region and a second implant region configured below a cathode region; and configuring a P-tap region along with the cathode region and configuring a N-tap region along with the anode region.

In an aspect, the P-tap region and the cathode region can be connected to a P-well, wherein the N-tap region and the anode region are connected to a N-well.

In another aspect, the proposed method can further include the step of siliciding the P-tap region and the cathode region along with the N-tap region and the anode region.

In an aspect, the present disclosure also relates to a semiconductor device comprising: a set of fins made of a semiconducting material, each of said set of fins comprising an active region that is above shallow trench isolation (STI) surface, and an inactive region that is sandwiched between STI region; an anode region formed using a first subset of said set of fins, wherein a first implant region is configured below said anode region; a cathode region formed using a second subset of said set of fins, wherein a second implant region is configured below said cathode region: wherein implant dopant in the first implant region is of conductivity type used in the anode region, and implant dopant in the second implant region is of conductivity type used in the cathode region.

In an aspect, the proposed semiconductor device can include one or more guard rings. The device can further include at least one fin made of nanowire or an array of nanowires on top of each other. In another aspect, the device can further include at least one fin made of any or a combination of Si, SiGe, and Ge, materials belonging to III-V or III-Nitride groups, transition metal dichalcogenides or other 2-Dimensional semiconductors.

In an aspect, 3D structure of the semiconductor device can be repeated in X and Y directions so as to create devices with larger electrical widths.

In an aspect, substrate of the proposed semiconductor device can pertain to any or a combination of a semiconductor, an insulator, and a stack of the semiconductor and insulator.

The present disclosure further relates to an integrated circuit made of the semiconductor device as mentioned above.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

FIG. 2 illustrates a prior art SCR device in SOI FinFET technology, wherein FIG. 2(a) illustrates top view and FIG. 2(b) indicates cross-sectional view.

FIG. 8(a) illustrates hole current density, FIG. 8(b) illustrates dp/dx with the distance from the contact, and FIG. 8(c) illustrates total cathode hole current vs. contact distance from the junction (Contact Height) in accordance with an exemplary embodiment of the present disclosure.

FIG. 9(a) illustrates TLP IV characteristics and FIG. 9(b) illustrates temperature profile of the proposed FinFET SCR for LAC=100 nm, HWELL=300 nm, N/P-tap spacing=40 nm, with different junction depths in accordance with an exemplary embodiment of the present disclosure.

DETAILED DESCRIPTION

Figure 1:
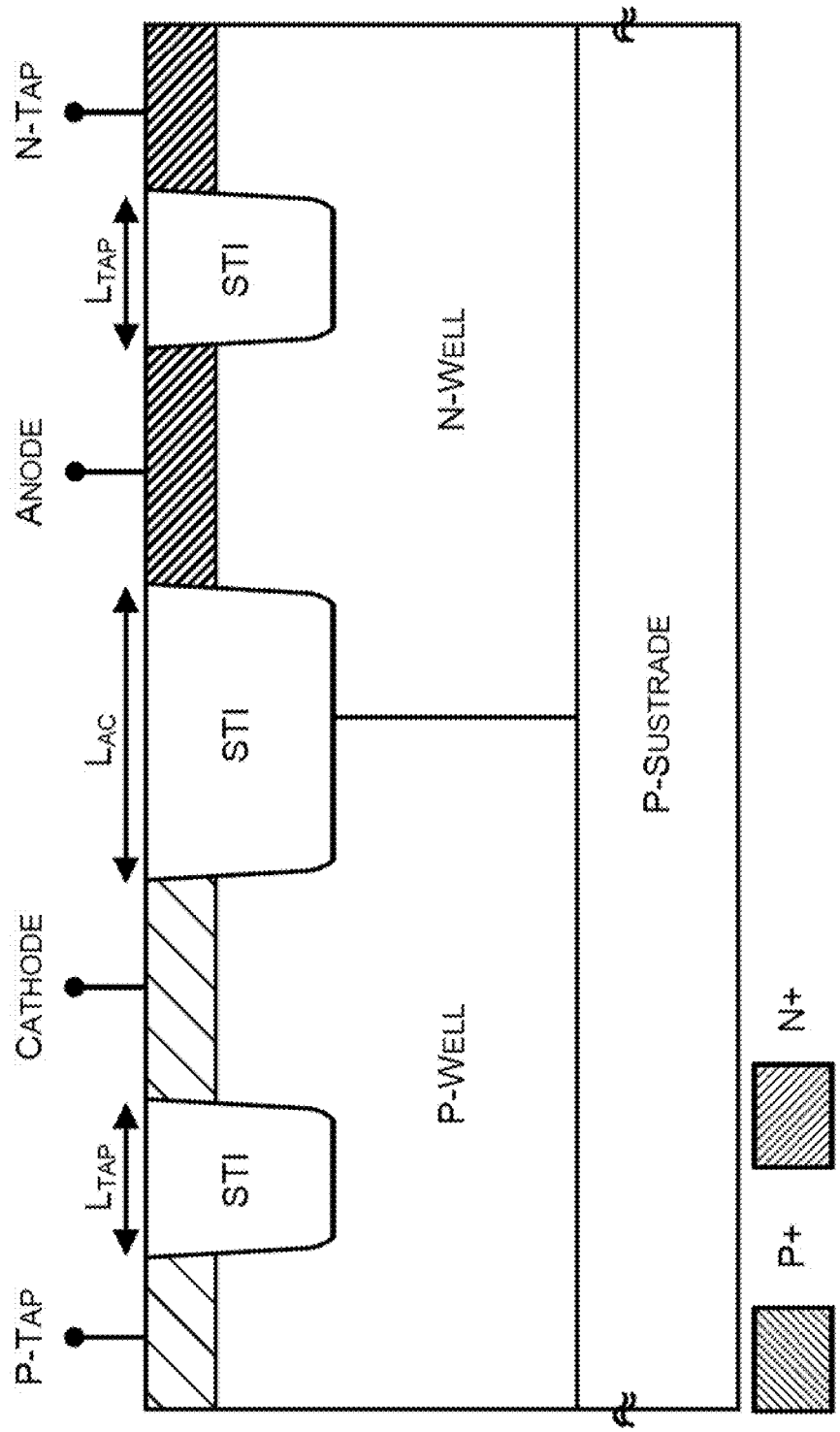
FIG. 1 illustrates a conventional planar SCR transistor (Prior Art).

The following is a detailed description of embodiments of the disclosure depicted in the accompanying drawings. The embodiments are in such detail as to clearly communicate the disclosure. However, the amount of detail offered is not intended to limit the anticipated variations of embodiments: on the contrary, the intention is to cover all modifications, equivalents, and alternatives falling within the spirit and scope of the present disclosure as defined by the appended claims.

Each of the appended claims defines a separate invention, which for infringement purposes is recognized as including equivalents to the various elements or limitations specified in the claims. Depending on the context, all references below to the "invention" may in some cases refer to certain specific embodiments only. In other cases it will be recognized that references to the "invention" will refer to subject matter recited in one or more, but not necessarily all, of the claims Various terms as used herein are shown below. To the extent a term used in a claim is not defined below, it should be given the broadest definition persons in the pertinent art have given that term as reflected in printed publications and issued patents at the time of filing.

The present invention relates generally to the field of semiconductor devices, and more particularly to non-planar semiconductor devices with effective and robust ESD protection.

The present disclosure is provided mainly to solve the technical problems of the prior art existed. The principle technical problem that the present disclosure solves is the issue of designing an effective ESD protection solution in non-planar technologies which provides higher ESD robustness with low turn-on and holding voltage. Specifically, the present disclosure solves a challenge from technology point of view to provide effective ESD protection in ultra scaled technologies, such as in SCR's, which suffers from high turn-on and holding voltage. This issue becomes even more severe in non-planar technologies and cannot be handled by conventional approaches such as diode- or transient-turn-on techniques.

In response to these problems, the present disclosure provides an engineered FinFET SCR design for efficient and robust ESD protection. Besides low trigger and holding voltage, the proposed device offers a 3 times better ESD robustness per unit area. The proposed device is compatible with standard process flow and design rules, has lower trigger voltage, holding voltage and on-resistance, and has no added capacitive loading.

Since, SCR predominantly functions with a positive feedback of two opposite polarity bipolar transistors; the solution provided according to the present disclosure is by providing an effective triggering mechanism of an SCR which is primarily correlated with the intrinsic gain of the individual bipolar transistors. The proposed SCR design offers an efficient parasitic BJT gain, which translates to efficient SCR action.

In an aspect, the present disclosure relates to a silicon controlled rectifier (SCR) comprising: an anode region below which is configured a first implant region; and a cathode region below which is configured a second implant region, wherein implant dopant in the first implant region is of conductivity type used in the anode region and implant dopant in the second implant region is of conductivity type used in the cathode region.

In an aspect, doping type from the anode region and the cathode region to the first implant region and the second implant region has continuous conductivity type.

In another aspect, the first and second implant regions can be implanted in inactive region that is sandwiched between STI below the anode and cathode regions.

In another aspect, there is no p-n junction between the anode/cathode regions and the first/second implant regions that are implanted underneath.

In yet another aspect, the first implant region and the second implant region can suppress minority carrier current from the anode/cathode regions so as to increase bipolar gain.

In yet another aspect, the SCR can include a P-well and a N-well that are configured on a substrate, wherein the P-well is connected to the cathode region and a P-tap region, and wherein the N-well is connected to the anode region and a N-tap region. The N-tap region and the P-tap region can be swapped with the anode region and the cathode region respectively. The N-tap region and the P-tap region can be used as independent contacts to trigger one or the other (PNP or NPN) parasitic bipolar of the SCR.

In another aspect, the first implant region and the second implant region can assist in obtaining a regenerative feedback between the base collector junctions of the two back-to back bipolar transistors to enable the SCR to shunt the ESD current.

In yet another aspect, the first implant region and the second implant region can be configured as deeper emitter junction profiles to improve snapback characteristics.

In yet another aspect, the SCR is a fin SCR.

The present disclosure further relates to a method of manufacturing a SCR, said method comprising the steps of: configuring an SCR implant that comprises a first implant region configured below an anode region and a second implant region configured below a cathode region; and configuring a P-tap region along with the cathode region and configuring a N-tap region along with the anode region. In an aspect, the P-tap region and the cathode region can be connected to a P-well, and wherein the N-tap region and the anode region are connected to a N-well. In yet another aspect, the proposed can further include the step of siliciding the P-tap region and the cathode region along with the N-tap region and the anode region.

The present disclosure further relates to a semiconductor device comprising an anode region below which is configured a first implant region; and a cathode region below which is configured a second implant region, wherein implant dopant in the first implant region is of conductivity type used in the anode region and implant dopant in the second implant region is of conductivity type used in the cathode region. In an aspect, the device can include one or more guard rings. In another aspect, the device can include at least one fin made of nanowire or an array of nanowires on top of each other. The fin can also be made of any or a combination of Si, SiGe, and Ge, materials belonging to III-V or III-Nitride groups, transition metal dichalcogenides or other 2-Dimensional semiconductors. In another aspect, 3D structure of the proposed semiconductor device can be repeated in X and Y directions so as to create devices with larger electrical widths. In yet another aspect, substrate of the device can pertain to any or a combination of a semiconductor, an insulator, and a stack of the semiconductor and insulator. In another aspect, the present disclosure relates to an integrated circuit made of semiconductor device as described above.

In another aspect, the present disclosure relates to a silicon controlled rectifier (SCR) comprising a set of fins made of a semiconducting material, each of said set of fins comprising an active region that is above shallow trench isolation (STI) surface, and an inactive region that is sandwiched between STI region: an anode region formed using a first subset of said set of fins, wherein a first implant region is configured below said anode region; a cathode region formed using a second subset of said set of fins, wherein a second implant region is configured below said cathode region, wherein implant dopant in the first implant region is of conductivity type used in the anode region, and implant dopant in the second implant region is of conductivity type used in the cathode region.

In an aspect, doping profile from the anode region and the cathode region to the first implant region and the second implant region respectively can be continuous in nature.

In another aspect, the first and second implant regions can be present in the inactive region that can be sandwiched between STI below the anode and cathode regions.

In another aspect, there may be no p-n junction between the anode/cathode regions and the first/second implant regions that are implanted underneath. In another aspect, the first implant region and the second implant region can suppress minority carrier current through the anode/cathode regions so as to increase bipolar gain.

In another aspect, the SCR can include a P-well and a N-well that can be configured on a substrate, wherein the cathode region and P-tap region can be disposed inside the P-Well, and wherein the anode region and N-tap region can be disposed inside the N-Well. In an aspect, the N-tap region and the P-tap region can be swapped with the anode region and the cathode region respectively. In another aspect, the N-tap region and the P-tap region can be used as independent contacts to trigger one or the other (PNP or NPN) parasitic bipolar of the SCR.

In an aspect, the first implant region and the second implant region can assist in obtaining a regenerative feedback between the base collector junctions of the two back-to back bipolar transistors to enable SCR to shunt the ESD current.

In an aspect, the first implant region and the second implant region can be configured as deeper emitters regions to improve snapback characteristics.

In another aspect, the SCR can be a Nanowire SCR where the set of fins is replaced by a set of semiconducting Nanowires.

The present disclosure further relates to a method of manufacturing a SCR, said method comprising the steps of: configuring an SCR implant that comprises a first implant region configured below an anode region and a second implant region configured below a cathode region; and configuring a P-tap region along with the cathode region and configuring a N-tap region along with the anode region.

In an aspect, the P-tap region and the cathode region can be connected to a P-well, wherein the N-tap region and the anode region are connected to a N-well.

In another aspect, the proposed method can further include the step of siliciding the P-tap region and the cathode region along with the N-tap region and the anode region.

In an aspect, the present disclosure also relates to a semiconductor device comprising: a set of fins made of a semiconducting material, each of said set of fins comprising an active region that is above shallow trench isolation (STI) surface, and an inactive region that is sandwiched between STI region; an anode region formed using a first subset of said set of fins, wherein a first implant region is configured below said anode region; a cathode region formed using a second subset of said set of fins, wherein a second implant region is configured below said cathode region: wherein implant dopant in the first implant region is of conductivity type used in the anode region, and implant dopant in the second implant region is of conductivity type used in the cathode region.

In an aspect, the proposed semiconductor device can include one or more guard rings. The device can further include at least one fin made of nanowire or an array of nanowires on top of each other. In another aspect, the device can further include at least one fin made of any or a combination of Si, SiGe, and Ge, materials belonging to III-V or III-Nitride groups, transition metal dichalcogenides or other 2-Dimensional semiconductors.

In an aspect, 3D structure of the semiconductor device can be repeated in X and Y directions so as to create devices with larger electrical widths.

In an aspect, substrate of the proposed semiconductor device can pertain to any or a combination of a semiconductor, an insulator, and a stack of the semiconductor and insulator.

The present disclosure further relates to an integrated circuit made of the semiconductor device as mentioned above.

FIG. 1 illustrates a conventional planar SCR transistor (Prior Art). Conventional planar SCR design as illustrated in FIG. 1 cannot be directly deployed to non-planar technologies due to technological limitations. Further, an obvious derivative based on conventional design fails to offer an SCR like behavior and therefore newer designs are needed to improve the bipolar efficiency and enable regenerative feedback mechanism. Conventional SCRs with a construction as in FIG. 1 also suffer from very high turn-on and holding voltage, which issue becomes even more severe in non-planar technologies and cannot be handled by conventional approaches like diode- or transient-turn-on techniques.

Figure 2:
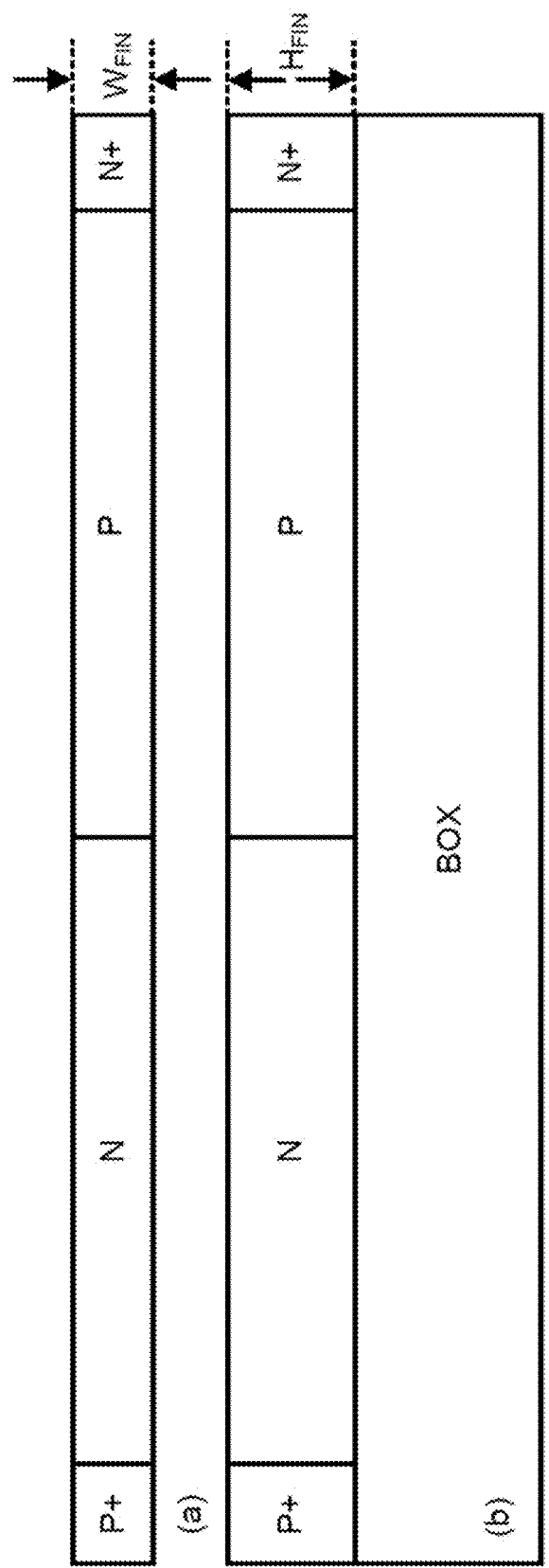

FIG. 2 illustrates a prior art SCR device in SOI FinFET technology, wherein FIG. 2(a) illustrates top view and FIG. 2(b) indicates cross-sectional view. A prior art SCR device (PNPN) for FinFET or planar SOI technology as illustrated in FIG. 2 does not provide options for tuning its trigger or holding voltage and suffers from high on-resistance.

Figure 3A:
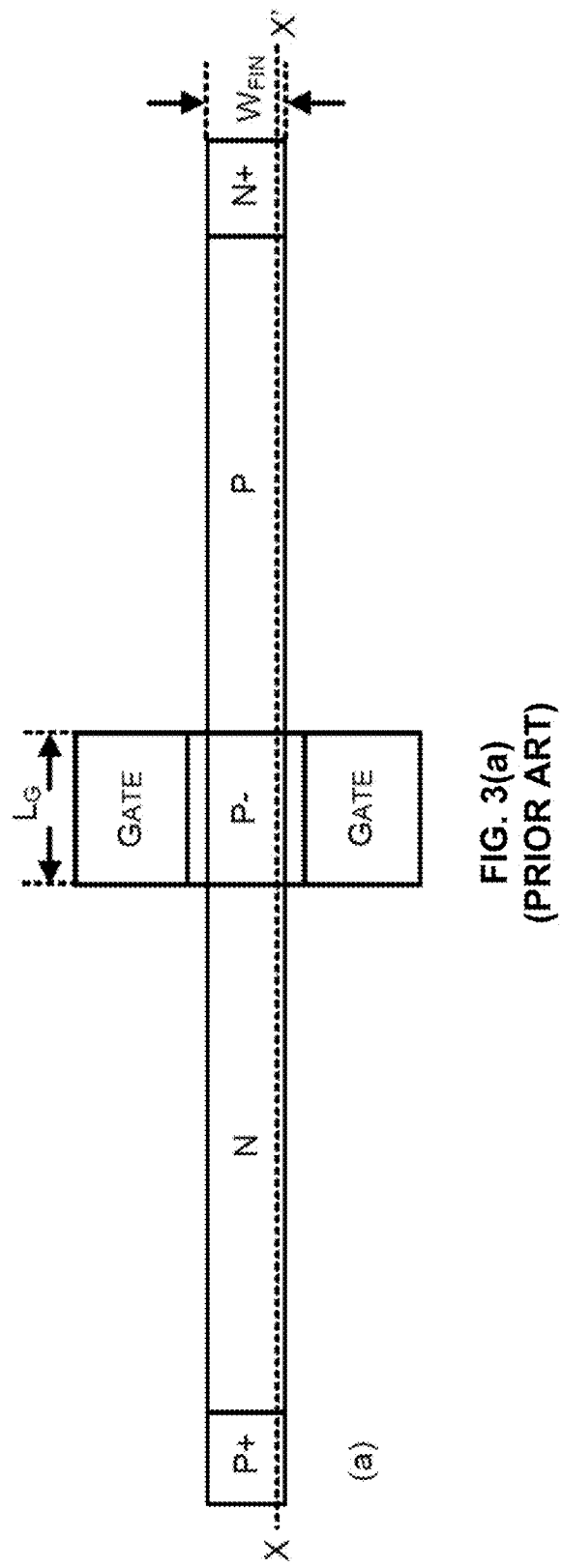
FIG. 3(a) shows a Surface parallel cut view and FIG. 3(b) shows a cross sectional view of gated SCR device in SOI FinFET Technology (prior art).
Figure 3B:
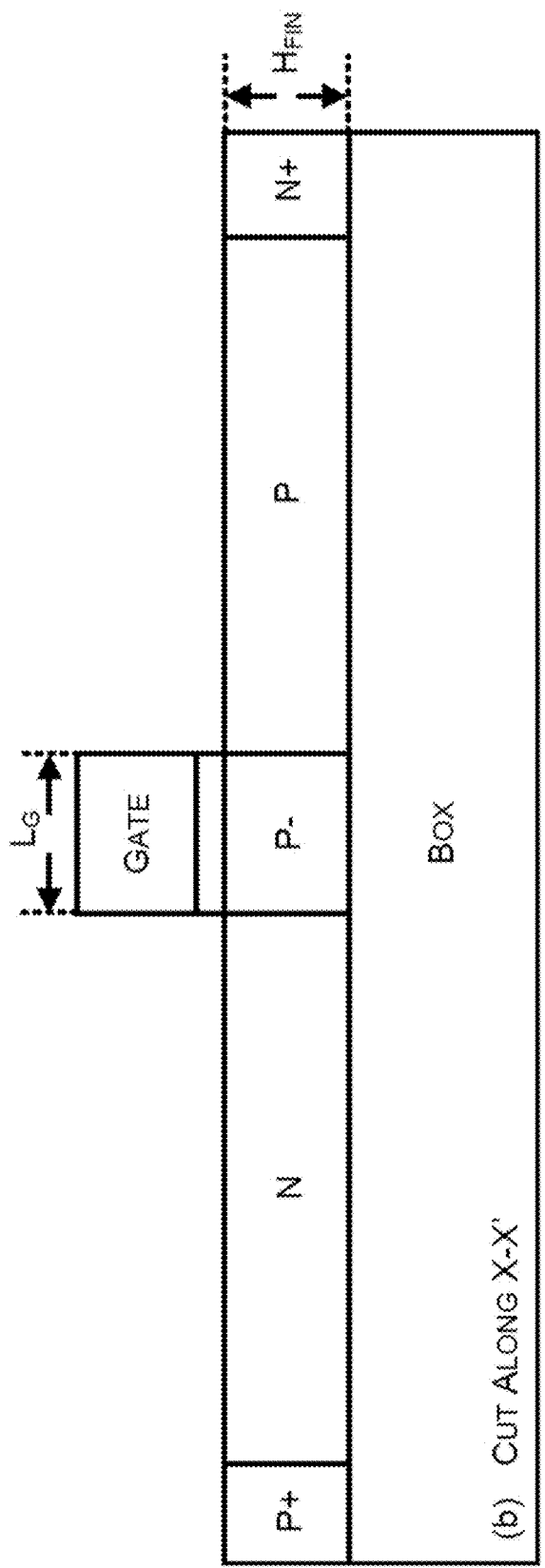

FIG. 3(a) shows a surface parallel cut view and FIG. 3(b) shows a cross sectional view of gated SCR device in SOI FinFET Technology (prior art). FIG. 3 shows a gated SCR device in planar SOI Technology, which is also applicable for emerging technologies like FinFET. This proposal provides a weak controllability over its turn-on voltage; however, it has no control over holding voltage and still suffers from high on-resistance.

Figure 4C:
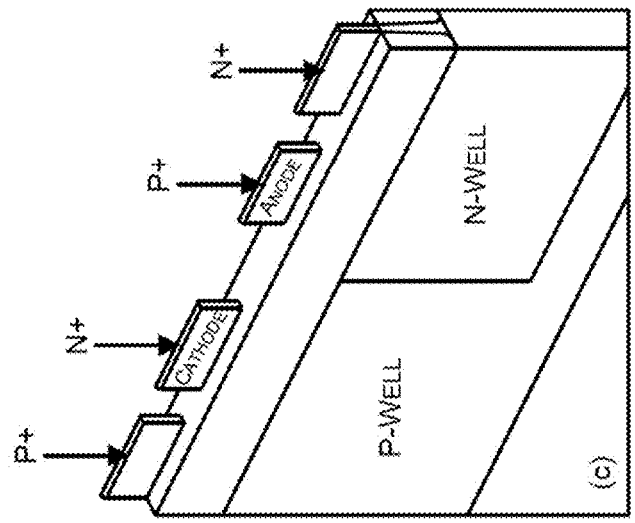
FIGS. 4(a) to 4(e) illustrate additional designs based on prior art.
Figure 4B:
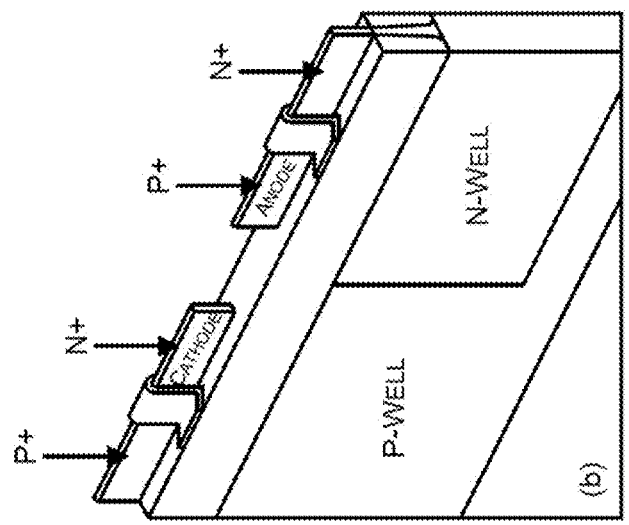
Figure 4A:
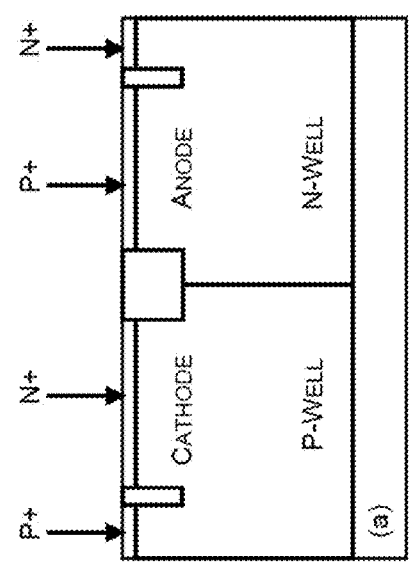
Figure 4E:
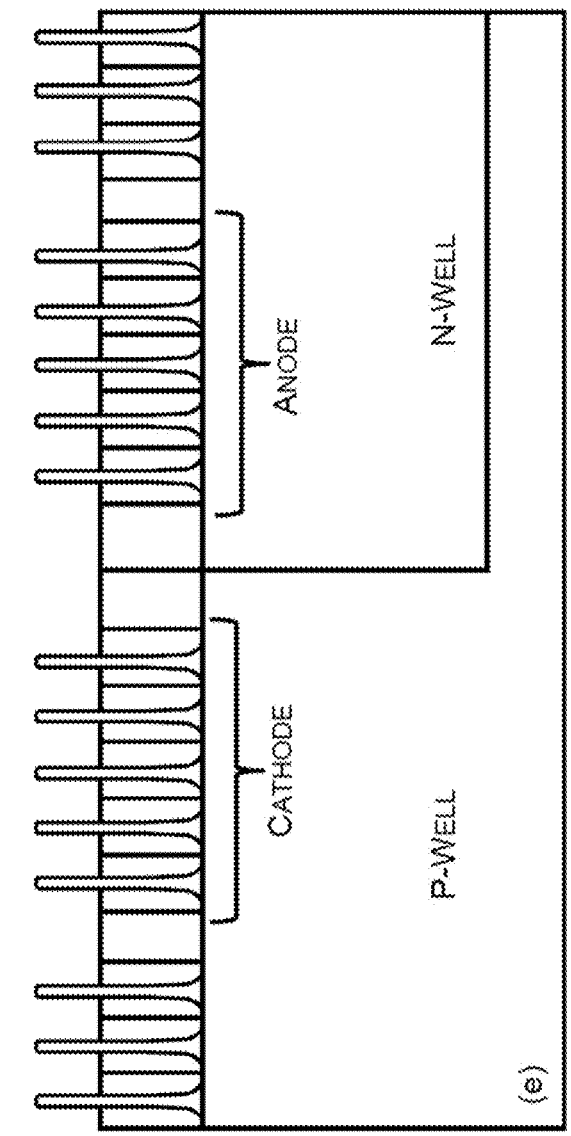
Figure 4D:
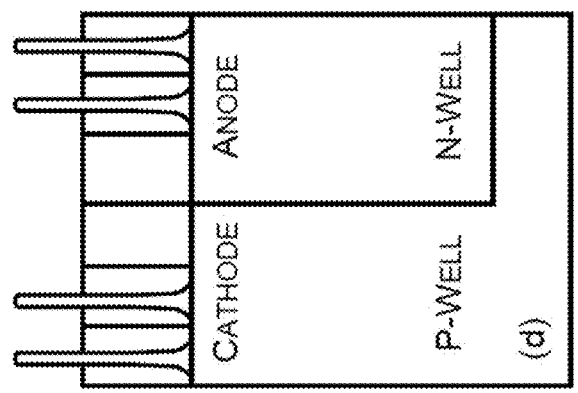

FIGS. 4(a) to 4(e) illustrate some additional known designs based on prior art. As illustrated, FIG. 4(a) shows 2D conventional planar SCR, while FIGS. 4(b) to 4(e) show 3D SCR concepts for non-planar technologies, wherein FIG. 4(b) is with gate isolation between anode/cathode and trigger taps, FIG. 4(c) is with shallow trench isolation (STI) between anode/cathode and trigger taps, FIG. 4(d) is 2D view of a fin-based SCR and FIG. 4(e) is 2D view of a multi-fin based SCR concept. Here Red indicates N type doping, while Blue indicates P type, wherein strength of color is equivalent to doping density.

Figures 5A, 5B:
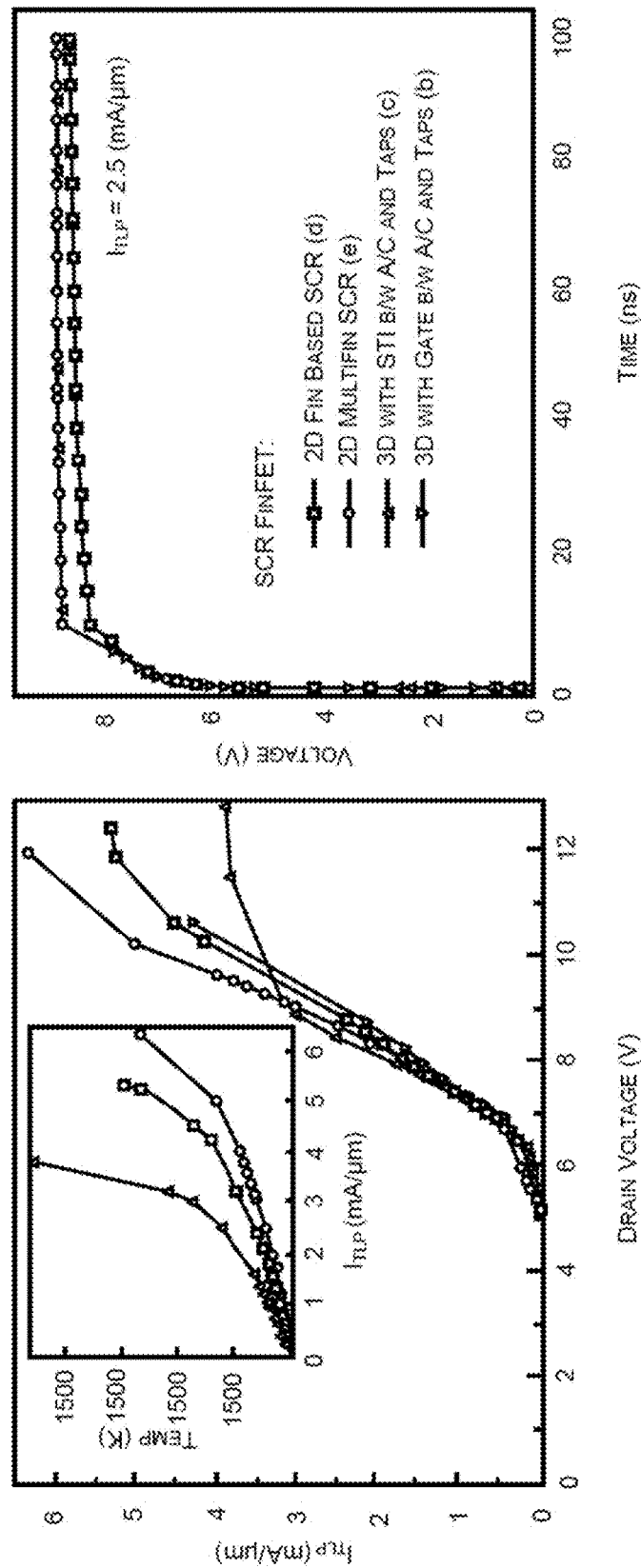
FIG. 5(a) illustrates simulated TLP IV characteristics and FIG. 5(b) depicts transient characteristics of conventional (prior art) Bulk FinFET SCR designs.

FIG. 5(a) illustrates simulated TLP IV characteristics while FIG. 5(b) illustrates transient characteristics of conventional (prior art) Bulk FinFET SCR designs. As illustrated, these SCR device structures show very high holding voltage of 6.5V.

Figure 6:
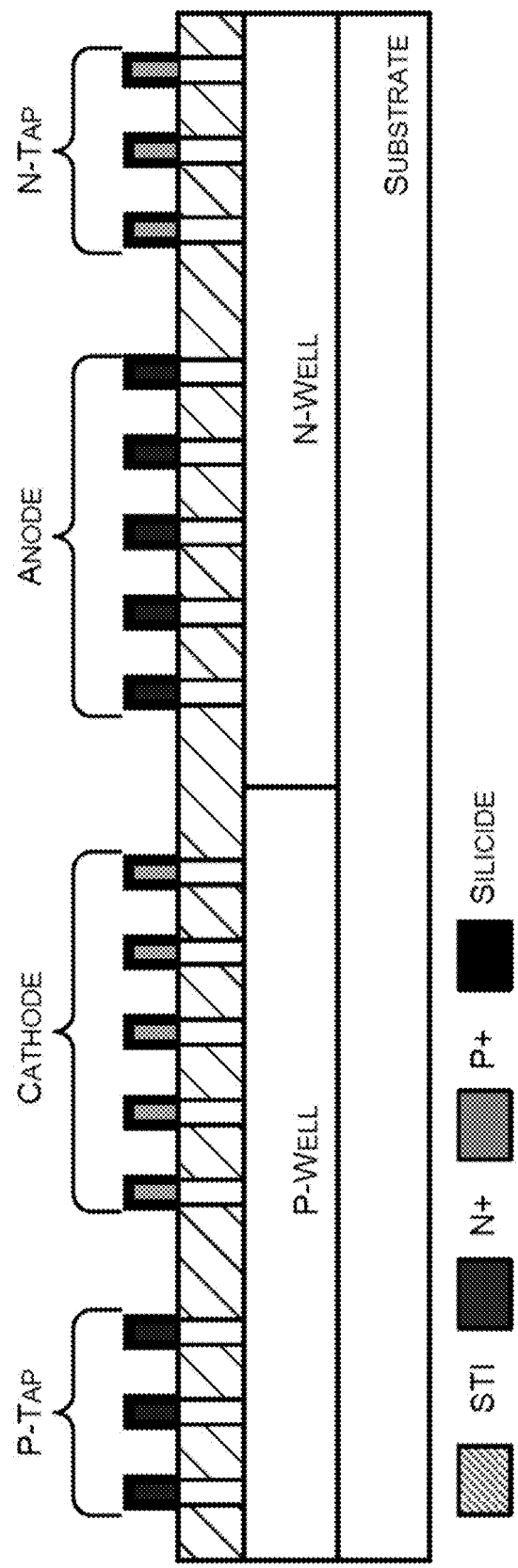
FIG. 6 shows schematic of a prior art silicided Fin SCR structure.

FIG. 6 shows schematic of a prior art silicided Fin SCR structure.

Figure 7:
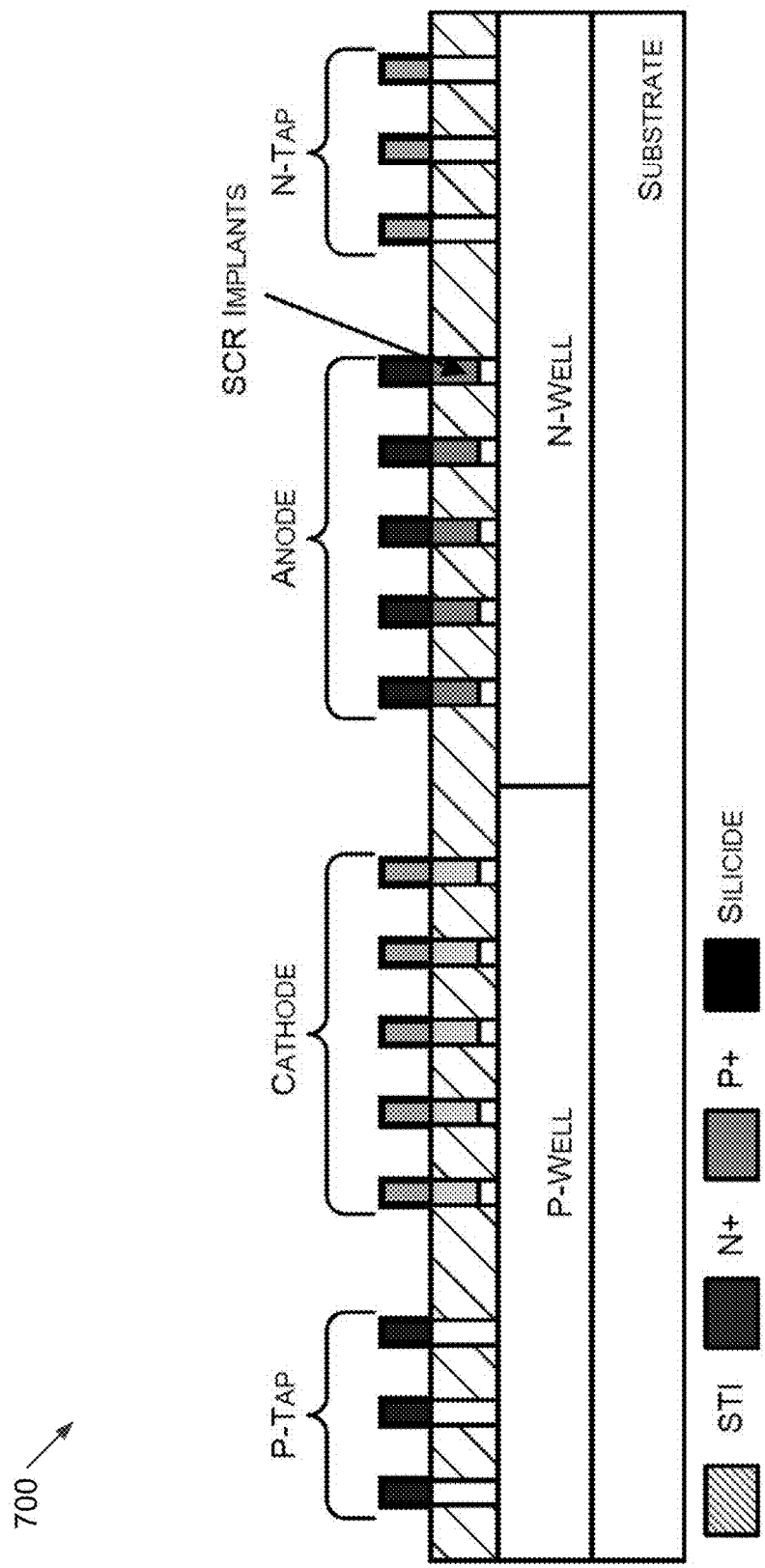
FIG. 7 illustrates a schematic of proposed Fin SCR structure with deep SCR implants only beneath the emitters in accordance with an exemplary embodiment of the present disclosure.

FIG. 7 illustrates a schematic of proposed Fin SCR structure with deep SCR implants only beneath the emitters in accordance with an exemplary embodiment of the present disclosure. In an aspect, the proposed invention discloses an engineered FinFET SCR design for efficient and robust ESD protection. Besides low trigger and holding voltage, the proposed device offers a 3 times better ESD robustness per unit area. In another aspect, the proposed disclosure further shows compatibility with standard process flow and design rules, lower trigger voltage, holding voltage and on-resistance and no added capacitive loading as its other major advantages.

In an aspect, proposed SCR predominantly functions with a positive feedback of two opposite polarity bipolar transistors. An effective triggering mechanism of an SCR is primarily correlated with intrinsic gain of individual bipolar transistors, wherein SCR design of the proposed invention offers an efficient parasitic BJT gain that translates to efficient SCR action.

As illustrated in FIG. 7, the proposed invention has special SCR implanted region underneath Cathode and Anode regions, where SCR implant dopant is same conductivity type as used in Anode and Cathode regions of ESD SCR device respectively. The implant is done in such a way or inactive Fin region (sandwich between STI) below active Fin is doped using SCR implant in such a way that doping type from anode/cathode region to the implant region underneath has continuous conductivity type. In other words, there must be no p-n junction between anode/cathode and SCR implanted region underneath.

FIG. 8(a) illustrates hole current density, FIG. 8(b) illustrates dp/dx with the distance from the contact, and FIG. 8(c) illustrates total cathode hole current vs. contact distance from the junction (Contact Height), in accordance with an exemplary embodiment of the present disclosure.

As illustrated, FIG. 8 shows that without SCR implant (HC=0), the extracted hole current through Cathode (electron current in case of Anode) is significantly higher, which is suppressed by 4× (four times) when SCR implant is introduced (HC=10 nm). As the minority carrier current from Anode/cathode is suppressed by SCR implant, bipolar gain increases significantly, which improves the SCR action as evident from FIG. 9.

FIG. 9(a) illustrates TLP IV characteristics and FIG. 9(b) illustrates temperature profile of the proposed FinFET SCR for LAC=100 nm, HWELL=300 nm, N/P-tap spacing-40 nm, with different junction depths in accordance with an exemplary embodiment of the present disclosure.

As illustrated, FIG. 9 shows that conventional device (JD=1 nm) has no SCR action (no snapback), whereas proposed design (JD=10 nm) offers an SCR action. In addition to this, the proposed device offers a 3 times better ESD current handling capability, per unit area, when compared to conventional device. The proposed SCR design (FIG. 7) consists of selectively doped cathode, anode, n- and p-trigger taps regions. The N-tap and anode regions are connected with the N-Well, whereas P-tap and cathode are connected to the P-Well. The N- and/or P-taps can be swapped with anode and cathode, respectively. They can also be used as independent contacts to trigger one or the other parasitic bipolar.

In an aspect, the key idea in SCR ESD protection device is to obtain a regenerative feedback between the base collector junctions of the two back-to back bipolar transistors, which enables the SCR to shunt the ESD current. This is achieved effectively in the proposed design, whereby incorporating deeper emitter junction profiles (or SCR implants), the snapback characteristic improves.

To elaborate upon operating principle of the proposed device, initially the n-Well-p-Well junction undergoes avalanche breakdown and the generated electrons are collected by the n-tap, and the generated holes are collected by the p-tap. As the holes migrate towards the p-tap, base potential of the n-p-n transistor is raised, which forward biases the base-emitter junction (here the p-Well-Cathode junction; thereby turning on the n-p-n transistor), further leading to the electron emission from the emitter (Cathode) terminal. These electrons then decrease the n-Well potential, which forward biases the n-well-anode junction, and turns on the p-n-p transistor. This regenerative feedback mechanism allows efficient turn-on of the both the bipolar transistors, and results in low trigger and holding voltage. The efficiency of the parasitic bipolar can be improved by incorporating deep emitter junction profiles (or SCR implants), which leads to efficient SCR action.

In an aspect, the proposed invention discloses a novel Fin SCR device with an SCR implant under the anode and cathode junctions where SCR implant dopant is same conductivity type as used in Anode and Cathode regions respectively. The implant is done in such a way or inactive Fin region (sandwich between STI) below active Fin is doped using SCR implant in such a way that doping type from anode/cathode region to the implant region underneath has continuous conductivity type. In other words, there must be no p-n junction between anode/cathode and SCR implanted region underneath.

As elaborated, proposed invention discloses SCR concepts for non-planar technologies with sub-3V trigger and holding voltage for efficient and robust ESD protection. This is achieved by deeper diffusion junction profiles. Besides low trigger and holding voltage, the proposed device offers a 3 times better ESD robustness per unit area.

Figure 10:
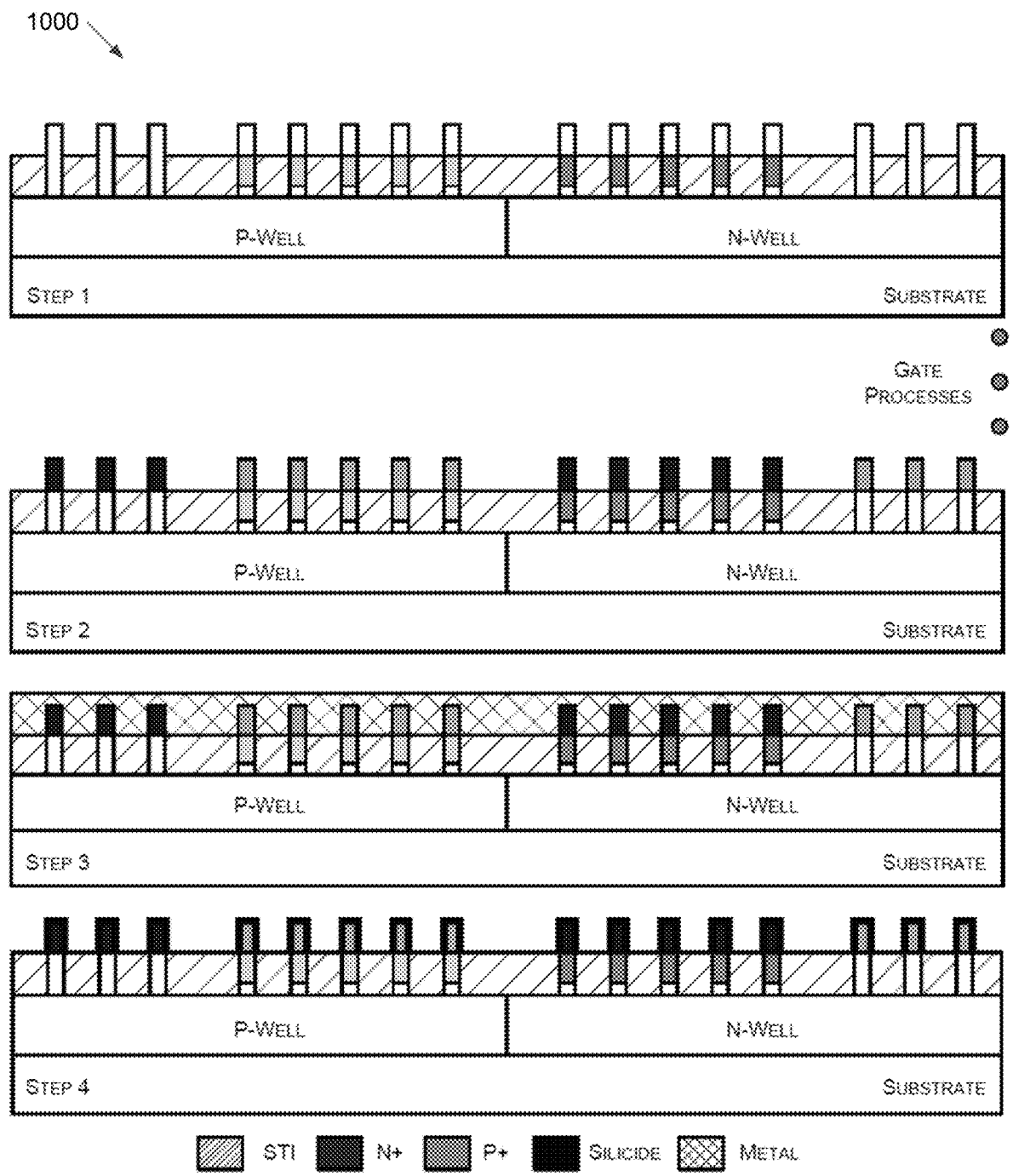
FIG. 10 illustrates process flow of the Proposed Fin SCR structure with deep SCR implants only beneath the emitters in accordance with an exemplary embodiment of the present disclosure.

FIG. 10 illustrates process flow of the Proposed Fin SCR structure, with deep SCR implants only beneath the emitters, in accordance with an exemplary embodiment of the present disclosure.

As illustrated in FIG. 10, a process flow for realizing the proposed SCR in standard FinFET CMOS process can be as indicated therein.

While the foregoing describes various embodiments of the invention, other and further embodiments of the invention may be devised without departing from the basic scope thereof. The scope of the invention is determined by the claims that follow. The invention is not limited to the described embodiments, versions or examples, which are included to enable a person having ordinary skill in the art to make and use the invention when combined with information and knowledge available to the person having ordinary skill in the art.

Advantages of the Invention

The present disclosure provides an effective ESD protection solution in non-planar technologies.

The present disclosure provides an effective ESD protection solution that enables low turn-on and holding voltage for efficient and robust ESD protection.

The present disclosure provides an effective ESD protection solution for ultra scaled technologies.

The present disclosure provides an effective ESD protection solution that enables robust tuning capability or low trigger/holding voltage.

We claim:

1. A silicon controlled rectifier (SCR) comprising:
a set of fins made of a semiconducting material, each of said set of fins comprising an active region that is above shallow trench isolation (STI) surface, and an inactive region that is sandwiched between STI region;
an anode region formed using a first subset of said set of fins, wherein a first implant region is configured below said anode region;
a cathode region formed using a second subset of said set of fins, wherein a second implant region is configured below said cathode region,
wherein implant dopant in the first implant region is of conductivity type used in the anode region, and implant dopant in the second implant region is of conductivity type used in the cathode region, and wherein the first implant region and the second implant region are configured as deeper emitters regions to improve snapback characteristics.

2. The SCR of claim 1, wherein doping profile from the anode region and the cathode region to the first implant region and the second implant region respectively is continuous in nature.

3. The SCR of claim 1, wherein the first and second implant regions are present in the inactive region that is sandwiched between STI below the anode and cathode regions.

4. The SCR of claim 1, wherein there is no p-n junction between the anode/cathode regions and the first/second implant regions that are implanted underneath.

5. The SCR of claim 1, wherein the first implant region and the second implant region suppress minority carrier current through the anode/cathode regions so as to increase bipolar gain.

6. The SCR of claim 1, wherein the SCR comprises a P-well and a N-well that are configured on a substrate, wherein the cathode region and P-tap region are disposed inside the P-Well and wherein the anode region and N-tap region are disposed inside the N-Well.

7. The SCR of claim 6, wherein the N-tap region and the P-tap region are swapped with the anode region and the cathode region respectively.

8. The SCR of claim 6, wherein the N-tap region and the P-tap region are used as independent contacts to trigger one or the other (PNP or NPN) parasitic bipolar of the SCR.

9. The SCR of claim 1, wherein the first implant region and the second implant region assist in obtaining a regenerative feedback between the base collector junctions of the two back-to back bipolar transistors to enable SCR to shunt the ESD current.

10. The SCR of claim 1, wherein the SCR is a Nanowire SCR where the set of fins is replaced by a set of semiconducting Nanowires.

11. A method of manufacturing a SCR, said method comprising the steps of:
configuring an SCR implant that comprises a first implant region configured below an anode region and a second implant region configured below a cathode region; and
configuring a P-tap region along with the cathode region and configuring a N-tap region along with the anode region, wherein the first implant region and the second implant region are configured as deeper emitters regions to improve snapback characteristics.

12. The method of claim 11, wherein the P-tap region and the cathode region are connected to a P-well, and wherein the N-tap region and the anode region are connected to a N-well.

13. The method of claim 11, further comprising a step of siliciding the P-tap region and the cathode region along with the N-tap region and the anode region.

14. A semiconductor device comprising:
a set of fins made of a semiconducting material, each of said set of fins comprising an active region that is above shallow trench isolation (STI) surface, and an inactive region that is sandwiched between STI region;
an anode region formed using a first subset of said set of fins, wherein a first implant region is configured below said anode region;
a cathode region formed using a second subset of said set of fins, wherein a second implant region is configured below said cathode region,
wherein implant dopant in the first implant region is of conductivity type used in the anode region, and implant dopant in the second implant region is of conductivity type used in the cathode region, and
wherein the first implant region and the second implant region are configured as deeper emitters regions to improve snapback characteristics.

15. The semiconductor device of claim 14, wherein the device comprises one or more guard rings.

16. The semiconductor device of claim 14, wherein the device comprises at least one fin made of nanowire or an array of nanowires on top of each other.

17. The semiconductor device of claim 14, wherein the device comprises at least one fin made of any or a combination of Si, SiGe, and Ge, materials belonging to III-V or III-Nitride groups, transition metal dichalcogenides or other 2-Dimensional semiconductors.

18. The semiconductor device of claim 14, wherein 3D structure of the semiconductor device is be repeated in X and Y directions so as to create devices with larger electrical widths.

19. The semiconductor device of claim 14, wherein substrate of the device pertains to any or a combination of a semiconductor, an insulator, and a stack of the semiconductor and insulator.

20. An integrated circuit made of semiconductor device as claimed in claim 14.

* * * * *